(12) United States Patent
Sasakura et al.

(10) Patent No.: US 10,607,959 B2
(45) Date of Patent: Mar. 31, 2020

(54) DISCHARGE EXAMINATION DEVICE, WIRE-BONDING APPARATUS, AND DISCHARGE EXAMINATION METHOD

(71) Applicant: SHINKAWA LTD., Tokyo (JP)

(72) Inventors: Kazumasa Sasakura, Tokyo (JP); Hiroaki Yoshino, Tokyo (JP); Yuki Sekine, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 223 days.

(21) Appl. No.: 15/238,732

(22) Filed: Aug. 17, 2016

(65) Prior Publication Data

US 2016/0358879 A1 Dec. 8, 2016

Related U.S. Application Data

(63) Continuation of application No. PCT/JP2015/053665, filed on Feb. 10, 2015.

(30) Foreign Application Priority Data

Feb. 17, 2014 (JP) ................................ 2014-027925

(51) Int. Cl.
*H01L 23/00* (2006.01)
*G01R 19/00* (2006.01)
*G04F 10/00* (2006.01)

(52) U.S. Cl.
CPC .......... *H01L 24/78* (2013.01); *G01R 19/0092* (2013.01); *G04F 10/00* (2013.01);
(Continued)

(58) Field of Classification Search
CPC ......... H01L 24/78; H01L 24/43; H01L 24/85; H01L 2924/00014; H01L 2224/78308; G01R 19/0092; G04F 10/00
See application file for complete search history.

(56) References Cited

U.S. PATENT DOCUMENTS 5,212,361 A 5/1993 Miyazaki et al.
5,214,259 A * 5/1993 Terakado ............. B23K 20/007
219/130.31
(Continued)

FOREIGN PATENT DOCUMENTS

| CN | 1773786 | 5/2006 |
|---|---|---|
| JP | H02-181943 | 7/1990 |
| JP | H03-017376 | 3/1991 |
| JP | H03-017377 B | 3/1991 |
| JP | H06-101491 | 12/1994 |

OTHER PUBLICATIONS

"Written Opinion (Form PCT/ISA/237)", dated May 19, 2015, with English translation thereof, pp. 1-6.
(Continued)

*Primary Examiner* — Akm Zakaria
(74) *Attorney, Agent, or Firm* — JCIPRNET (57) ABSTRACT

A discharge examination device for examining discharge of a wire-bonding apparatus that applies a voltage between a torch electrode and a wire to procure the discharge therebetween includes a current detection unit, a timer unit and a discharge determination unit. The current detection unit detects a discharge current flowing through the wire. The timer unit measures discharge detection time after application of the voltage before detection of the discharge current. The discharge determination unit determines whether or not the discharge is abnormal based on the discharge detection time. With this, a discharge examination device, a wire-bonding apparatus, and a discharge examination method that are capable of detecting abnormality of discharge are provided.

8 Claims, 8 Drawing Sheets

(52) U.S. Cl.
CPC .............. *H01L 24/43* (2013.01); *H01L 24/85* (2013.01); *H01L 24/45* (2013.01); *H01L 24/48* (2013.01); *H01L 2224/32225* (2013.01); *H01L 2224/437* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/48463* (2013.01); *H01L 2224/48465* (2013.01); *H01L 2224/73265* (2013.01); *H01L 2224/78268* (2013.01); *H01L 2224/78271* (2013.01); *H01L 2224/78301* (2013.01); *H01L 2224/78308* (2013.01); *H01L 2224/78349* (2013.01); *H01L 2224/78353* (2013.01); *H01L 2224/859* (2013.01); *H01L 2224/85045* (2013.01); *H01L 2224/85181* (2013.01); *H01L 2224/85205* (2013.01); *H01L 2924/00014* (2013.01)

(56) References Cited

U.S. PATENT DOCUMENTS

| | | | | |
|---|---|---|---|---|
| 5,463,197 A * | 10/1995 | Miyazaki | ............. | B23K 20/007 219/130.21 |
| 5,496,984 A * | 3/1996 | Goto | ....................... | B23H 1/024 219/69.13 |
| 5,988,482 A * | 11/1999 | Sasakura | ............. | B23K 20/007 219/56.21 |
| 6,898,849 B2 * | 5/2005 | Trejo | ................... | B23K 20/007 219/56.21 |
| 9,314,869 B2 * | 4/2016 | Lee | ....................... | B23K 20/007 |
| 2010/0147805 A1 * | 6/2010 | Ukai | ..................... | B23H 1/022 219/69.13 |

OTHER PUBLICATIONS

"Office Action of China Counterpart Application," with English translation thereof, dated May 3, 2018, p. 1-p. 15.
"Office Action of China Counterpart Application," dated Dec. 20, 2018, with English translation thereof, p. 1-p. 18.

* cited by examiner

DISCHARGE EXAMINATION DEVICE, WIRE-BONDING APPARATUS, AND DISCHARGE EXAMINATION METHOD

CROSS REFERENCE TO RELATED APPLICATIONS

This application is a Continuation of PCT International Application No. PCT/JP2015/053665, filed on Feb. 10, 2015, which claims priority under 35 U.S.C § 119(a) to Patent Application No. 2014-027925, filed in Japan on Feb. 17, 2014, all of which are hereby expressly incorporated by reference into the present application.

TECHNICAL FIELD

Aspects of the disclosure relates to a discharge examination device, a wire-bonding apparatus, and a discharge examination method.

BACKGROUND ART

In a method of fabricating semiconductor devices, wire bonding in which an electrode of a semiconductor device and a line of a substrate are electrically connected via a wire has been widely used, for example. Typical examples of wire bonding include a so-called ball bonding method. Specifically, a voltage is applied to produce discharge between an electrode and a wire inserted through a bonding tool (e.g., capillary) to form a ball at a tip of the wire. Then, the bonding tool is moved downward toward an electrode of a semiconductor device, and the ball of the wire is bonded onto the electrode of the semiconductor device after applying a load and ultrasonic vibration to the ball.

As a wire-bonding apparatus employing the ball bonding method, there is known an apparatus in which a discharge condition is controlled in order to form uniform balls at as tip of a wire by comparing a value equivalent to Joule heat during ball formation based on a discharge voltage and a discharge current generated between an electrode and a tip of a wire with a set value of a heat amount that has been previously set (cf. PTL 1, for example).

CITATION LIST

Patent Literature

PTL 1: Japanese Unexamined Patent Application Publication No. 02-181943

Incidentally, the conventional wire bonding apparatus is determined whether or not a wire is inserted through the bonding tool by utilizing a function of a non-bonding determination provided in the wire bonding apparatus, and the wire-bonding apparatus is stopped when a wire is not inserted through the bonding tool in such a case in which the wire falls out of the bonding tool, for example.

In contrast, in a case in which the wire does not extend from a tip of the bonding tool, or in which the wire extending from the tip of the bonding tool is short, while discharge is produced between the electrode and the bonding tool or the wire, no ball is formed or a desired ball is not formed at a tip of the wire. Discharge in such cases is considered to be abnormal.

However, in these cases, it is not possible to detect abnormality with the function of non-bonding determination, as the wire is inserted through the bonding tool. As a result, the conventional wire-bonding apparatus often performs wire bonding with a ball being unformed or remaining defective, thus resulting in defects in semiconductor devices.

SUMMARY OF DISCLOSURE

Technical Problem

Aspects of the disclosure have been made in view of the above problems, and that the disclosure is to provide a discharge examination device, a wire-bonding apparatus, and a discharge examination method that are capable of determining whether or not discharge is abnormal.

Solution to Problem

A discharge examination device according to one aspect of the disclosure is a discharge examination device for examining discharge of a wire-bonding apparatus that applies a voltage between an electrode and a wire to procure the discharge therebetween, the device including: a current detection unit configured to detect a discharge current flowing through the wire; a timer unit configured to measure discharge detection time after application of the voltage before detection of the discharge current; and a discharge determination unit configured to determine whether or not the discharge is abnormal based on the discharge detection time.

According to the discharge examination device, the discharge determination unit can determine whether or not the discharge detection time is out of a predetermined range based on a threshold, and determine that the discharge is abnormal when the discharge detection time is out of the predetermined range.

According to the discharge examination device, the discharge determination unit can cause recording means to record the discharge detection time if the discharge is determined to be not abnormal, and the device can further include: a threshold setting unit configured to set the threshold based on the discharge detection time recorded in the recording means.

According to the discharge examination device, the threshold setting unit can set the threshold, when the discharge detection time is recorded in the recording means, based on a predetermined number of pieces of the discharge detection time that are most recently recorded.

The discharge examination device can further include: a signal output unit configured to output a discharge abnormal signal to the wire-bonding apparatus when the discharge determination unit has determined that the discharge is abnormal, the discharge abnormal signal indicating that the discharge is abnormal.

The discharge examination device can further include: a voltage detection unit configured to detect the voltage, wherein the discharge determination unit can determine whether or not the discharge is abnormal based on the discharge detection time and the voltage.

A wire-bonding apparatus according to one aspect of the disclosure includes the discharge examination device described above.

A discharge examination method according to one aspect of the disclosure is a discharge examination method of examining discharge of a wire-bonding apparatus that applies a voltage between an electrode and a wire to procure the discharge therebetween, the method including: a current detecting step of detecting a discharge current flowing through the wire; a timer step of measuring discharge detection time after application of the voltage before detection of the discharge current; and a discharge determining step of determining whether or not the discharge is abnormal based on the discharge detection time.

Advantageous Effect of Disclosure

According to the disclosure, by determining whether or not discharge is abnormal based on the discharge detection time after application of a voltage before a discharge current is detected, it is possible to determine the discharge is abnormal when discharge is produced in a case in which either the tip of the wire does not extend at all from the bonding tool, or the wire extending from the bonding tool is either shorter or longer than the predetermined length. Therefore, in the case in which no ball is formed or a desired ball is not formed at the tip of the wire, it is possible to prevent the wire-bonding apparatus from performing wire bonding, and thus to reduce the percent defective (improve the yield rate) of semiconductor devices.

DESCRIPTION OF EMBODIMENT

Hereinafter, an embodiment of the disclosure will be described. In the appended drawings, like or identical components are denoted by like or identical reference numerals. It should be noted that the drawings are schematic drawings. Therefore, specific dimensions and the like should be determined based on the following description. It should also be understood that ratios and proportions of dimensions can be different between the drawings. In addition, the technical scope of the disclosure should not be considered to be restricted to this embodiment. Note, in the following description, that an upper side, a lower side, a left side, and a right side in the drawings are respectively referred to as "top or above", "bottom or under", "left", and "right".

Figure 1:
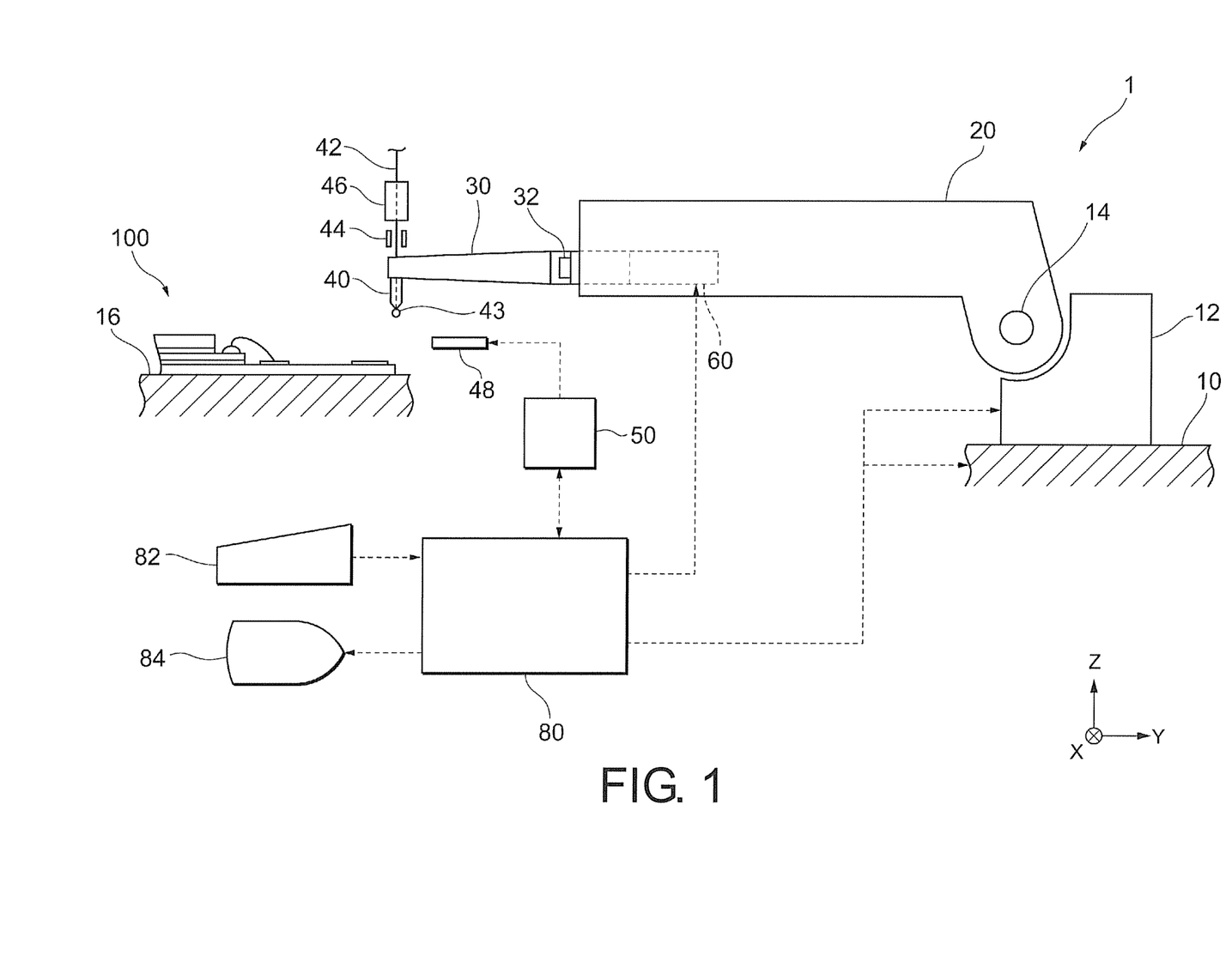
FIG. 1 is a schematic configurational diagram for illustrating one example of a wire-bonding apparatus according to this embodiment.

FIG. 1 through FIG. 8 are provided for illustrating one embodiment of a discharge examination device, a wire-bonding apparatus, and a discharge examination method according to the disclosure. FIG. 1 is a schematic configurational diagram for illustrating one example of the wire-bonding apparatus according to this embodiment. A wire-bonding apparatus 1 according to this embodiment is an apparatus used for performing wire bonding. The wire-bonding apparatus 1 includes a discharge examination device 50 according to this embodiment.

Referring to FIG. 1, the wire-bonding apparatus 1 includes an XY driving mechanism 10, a bonding arm 20, an ultrasonic horn 30, a bonding tool 40, the discharge examination device 50, an ultrasonic vibrator 60, and a controller 80.

The XY driving mechanism 10 is configured movably in an XY axis direction (planar direction), and the XY driving mechanism (linear motor) 10 is provided with a Z driving mechanism (linear motor) 12 capable of moving the bonding arm 20 in a Z axis direction (up-down direction).

The bonding arm 20 is supported with an arm supporting shaft 14, and configured swingably with respect to the XY driving mechanism 10. The bonding arm 20 is provided in a substantial cuboid so as to extend from the XY driving mechanism 10, and configured to, during wire bonding, move to a position at a predetermined distance from a bonding stage 16 on which a semiconductor device 100 as a bonding target is placed.

The ultrasonic horn 30 is attached to an end of the bonding arm 20 using a horn fixation thread 32. The ultrasonic horn 30 has the bonding tool 40 at its end. The ultrasonic vibrator 60 produces ultrasonic vibration, which is transmitted to the bonding tool 40 via the ultrasonic horn 30, and thus ultrasonic vibration can be applied to a bonding target via the bonding tool 40. Examples of the ultrasonic vibrator 60 include a piezoelectric vibrator.

The bonding tool 40 is a tool for functioning as a bonding element as well as for guiding a wire 42. One example of the bonding tool 40 is a capillary having an insertion hole. In this case, the bonding tool 40 is configured such that the wire 42 used for bonding is inserted through the insertion hole of the bonding tool 40 and is able to payout a portion of the wire 42 from a tip of the bonding tool 40. The bonding tool 40 is attached to the ultrasonic horn 30 in a replaceable manner by strength of a spring or the like. Further, a wire clamper 44 is provided above the bonding tool 40. The wire clamper 44 is configured to hold and release the wire 42 at predetermined timing. Further above the wire clamper 44, a wire tensioner 46 is provided. The wire tensioner 46 is configured to insert the wire 42 and apply an appropriate degree of tension to the wire 42 during bonding.

A material of the wire 42 can be selected as needed based on conditions such as workability and low electrical resistance, and examples of such a material to be used include gold (Au), copper (Cu), and silver (Ag).

A torch electrode 48 is an electrode for producing a discharge (spark). The torch electrode 48 is configured to be able to form a ball 43 at a tip of the wire 42 (one end), which is paying-out from the tip of the bonding tool 40, using heat of discharge. Further, a position of the torch electrode 48 is fixed. During discharge, the bonding tool 40 moves to a position at a predetermined distance from the torch electrode 48 to produce an appropriate degree of discharge between the torch electrode 48 and the tip (one end) of the wire 42.

The discharge examination device 50 is a device that is used in the discharge examination method of the wire-bonding apparatus 1 according to this embodiment. Further, the discharge examination device 50 is connected to the torch electrode 48, and for having the torch electrode 48 produce discharge. Moreover, the discharge examination device 50 and the controller 80 are configured such that signal transmission therebetween is possible so that one of them is able to actuate or stop a function of the other.

The controller 80 is connected to the XY driving mechanism 10, the Z driving mechanism 12, the ultrasonic horn 30 (the ultrasonic vibrator 60), and a discharge examination device 50. By having the controller 80 control these components, it is possible to perform a process required for wire bonding. The controller 80 includes interfaces (not shown) for signal transmission with the components described above such as the XY driving mechanism 10, the Z driving mechanism 12, the ultrasonic horn 30 (the ultrasonic vibrator 60), and the discharge examination device 50.

Further, to the controller 80, an operation unit 82 for inputting control information and a display unit 84 for outputting control information are connected. Using these components, an operator is able to input necessary control information through the operation unit 82 while confirming a screen using the display unit 84. The controller 80 can be configured as a computer including components such as a CPU and a memory, in which a program and data required for wire bonding are recorded in advance.

Figure 2:
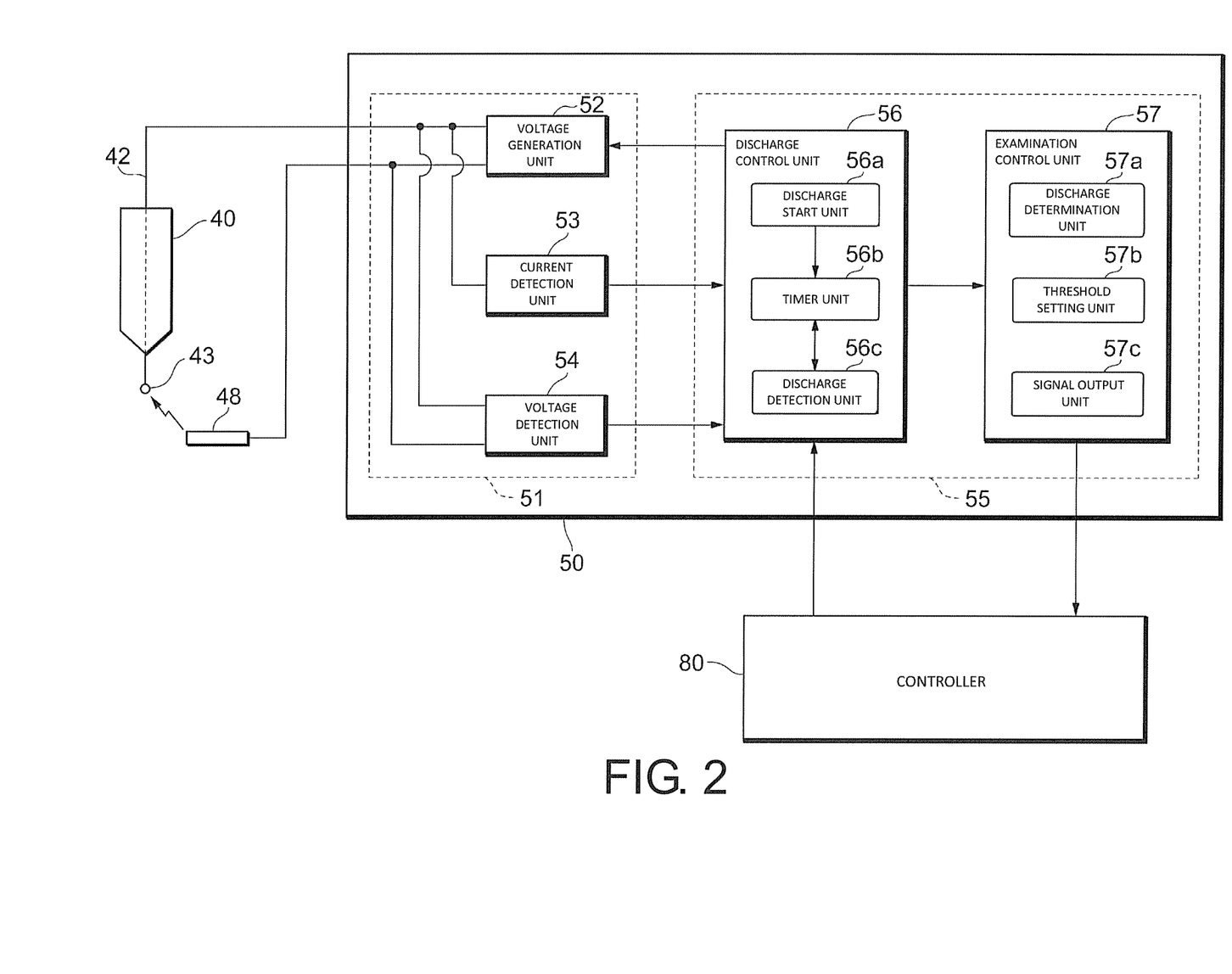
FIG. 2 is a schematic configurational diagram for illustrating one example of a discharge examination device according to this embodiment.

FIG. 2 is a schematic configurational diagram for illustrating one example of the discharge examination device according to this embodiment. The discharge examination device 50 is a device for performing examination of discharge of the wire-bonding apparatus 1. As illustrated in FIG. 2, the discharge examination device 50 includes a high-voltage circuit 51 and a control circuit 55.

The high-voltage circuit 51 is a circuit for performing discharge and for detecting an electrical signal relating to discharge. The high-voltage circuit 51 includes a voltage generation unit 52, a current detection unit 53, and a voltage detection unit 54.

The voltage generation unit 52 is a unit for generating a voltage. The voltage generation unit 52 is connected to the control circuit 55, and generates a predetermined high voltage, e.g., a high voltage up to about 5000 [V], based on a control signal from the control circuit 55. Further, the voltage generation unit 52 is also connected to the torch electrode 48, and to the other end of the wire 42 that is on the other side of the end (one end) of the wire 42 paid-out from the bonding tool 40. The voltage generation unit 52 is configured to apply the generated high voltage between the torch electrode 48 and the wire 42. With this, discharge is performed between the torch electrode 48 and the tip (one end) of the wire 42.

The voltage generation unit 52 can be configured to include a booster transformer (transformer), for example. As the booster transformer, a linear-output transformer having both a constant voltage function and a constant current function is used, for example.

The current detection unit 53 is a unit for detecting a current, and connected to the other end of the wire 42. The current detection unit 53 is also connected to the control circuit 55, and configured to output a detection signal of a discharge current to the control circuit 55 upon flowing of the discharge current through the wire 42 due to discharge.

The current detection unit 53 can be configured to include a resistor for detecting a discharge current, a power source as a threshold, and a comparator, for example. In this case, the current detection unit 53 outputs a detection signal of a discharge current when a voltage value of the discharge current is higher than a voltage value of the power source.

The voltage detection unit 54 is a unit for detecting a voltage, and connected to the torch electrode 48 and the other end of the wire 42. The voltage detection unit 54 is also connected to the control circuit 55, and is configured to output a voltage signal to the control circuit 55 upon application of a voltage between the torch electrode 48 and the wire 42.

The control circuit 55 is a circuit for controlling discharge and examination of discharge. The control circuit 55 includes a discharge control unit 56 and an examination control unit 57. The control circuit 55 is configured to allow transmission of signals and information (data) between the discharge control unit 56 and the examination control unit 57.

The discharge control unit 56 is configured to control start, end, and a value of a voltage applied between the torch electrode 48 and the wire 42, as well as a time period during which the voltage value is applied. The discharge control unit 56 can be configured to include a FPGA (Field Programmable Gate Array), for example, and operates according to a program specified in a hardware description language (HDL). Further, the discharge control unit 56 includes interfaces (not shown) for signal transmission with the components of the high-voltage circuit 51 described above such as the voltage generation unit 52, the current detection unit 53, and the voltage detection unit 54. As one example of its functional configuration, the discharge control unit 56 further includes a discharge start unit 56a, a timer unit 56b, and a discharge detection unit 56c.

The discharge start unit 56a outputs, to the voltage generation unit 52, a voltage-application-start control signal for starting application of a voltage between the torch electrode 48 and the wire 42 based on a control signal from the controller 80.

Further, in addition to outputting of the voltage-application-start control signal to the voltage generation unit 52, the discharge start unit 56a also outputs, to the timer unit 56b, a start signal (start signal) for starting to measure time.

The timer unit 56b is a unit for counting time in a predetermined period. The timer unit 56b can be configured by an IC chip having a clock function, such as an oscillation circuit (clock generator) or an RTC (Real Time Clock), and starts measurement of time by the start signal (start signal), stops measurement of time by a stop signal (stop signal), and outputs the measured time.

The discharge detection unit 56c outputs, to the timer unit 56b, a stop signal (stop signal) for stopping measurement of time based on the detection signal of the discharge current from the current detection unit 53. At this time, the time measured by the timer unit 56b is input to the discharge detection unit 56c. With this, using the timer unit 56b, it is possible to measure discharge detection time after application of a voltage before detection of a discharge current.

Further, the discharge detection unit 56c outputs information of the discharge detection time measured by timer unit 56c to the examination control unit 57. In addition, based on the voltage signal from the voltage detection unit 54, the discharge detection unit 56c outputs information of a voltage value to the examination control unit 57.

The examination control unit 57 can be configured to include a CPU (Central Processing Unit) and a memory (recording means), for example, and operates according to a program specified in a predetermined language. As one example of its functional configuration, the examination control unit 57 further includes a discharge determination unit 57a, a threshold setting unit 57b, and a signal output unit 57c.

The discharge determination unit 57a determines whether or not discharge is abnormal based on the information of the discharge detection time from the discharge detection unit 56c. Alternatively, the discharge determination unit 57a determines whether or not discharge is abnormal based on the information of the discharge detection time and the information of the voltage value from the discharge detection unit 56c.

Further, if it is determined that the discharge is not abnormal, that is, the discharge is normal, the discharge determination unit 57a writes and stores the information of the discharge detection time from the discharge detection unit 56c in the memory (recording means).

The memory (recording means) included in the examination control unit 57 has a storage capacity (memory area) capable of storing pieces of the information of the discharge detection time of a predetermined number, e.g., 20. The information of the discharge detection time is recorded additionally in the memory (recording means) up to the predetermined number of pieces. Thereafter, a new piece of the information is added after one of the recorded pieces of the information that has been recoded first is deleted from the memory (recording means). With this, most recent (newest) pieces of the information of the discharge detection time of the predetermined number are recorded in the memory (recording means).

The threshold setting unit 57b sets a threshold based on the information of the discharge detection time recorded in the memory (recording means). The threshold is used in comparison with the information of the discharge detection time input from the discharge detection unit 56c, and an initial value of the threshold is recorded in the memory (recording means) in advance.

Based on the determination result of the discharge determination unit 57a, the signal output unit 57c outputs a predetermined signal representing the determination result to the controller 80, that is, the wire-bonding apparatus 1. Examples of the predetermined signal include a normal discharge signal indicating that the discharge is normal and an abnormal discharge signal indicating that the discharge is abnormal.

In this embodiment, the example in which the examination control unit 57 includes the memory (recording means) in which the information of the discharge detection time is recorded is described, but the disclosure is not limited to such an example. The memory (recording means) in which the information of the discharge detection time is recorded can be included in the controller 80.

Next, the method of examining discharge of the wire-bonding apparatus 1 will be described with reference to FIG. 3 through FIG. 8.

Figure 3:
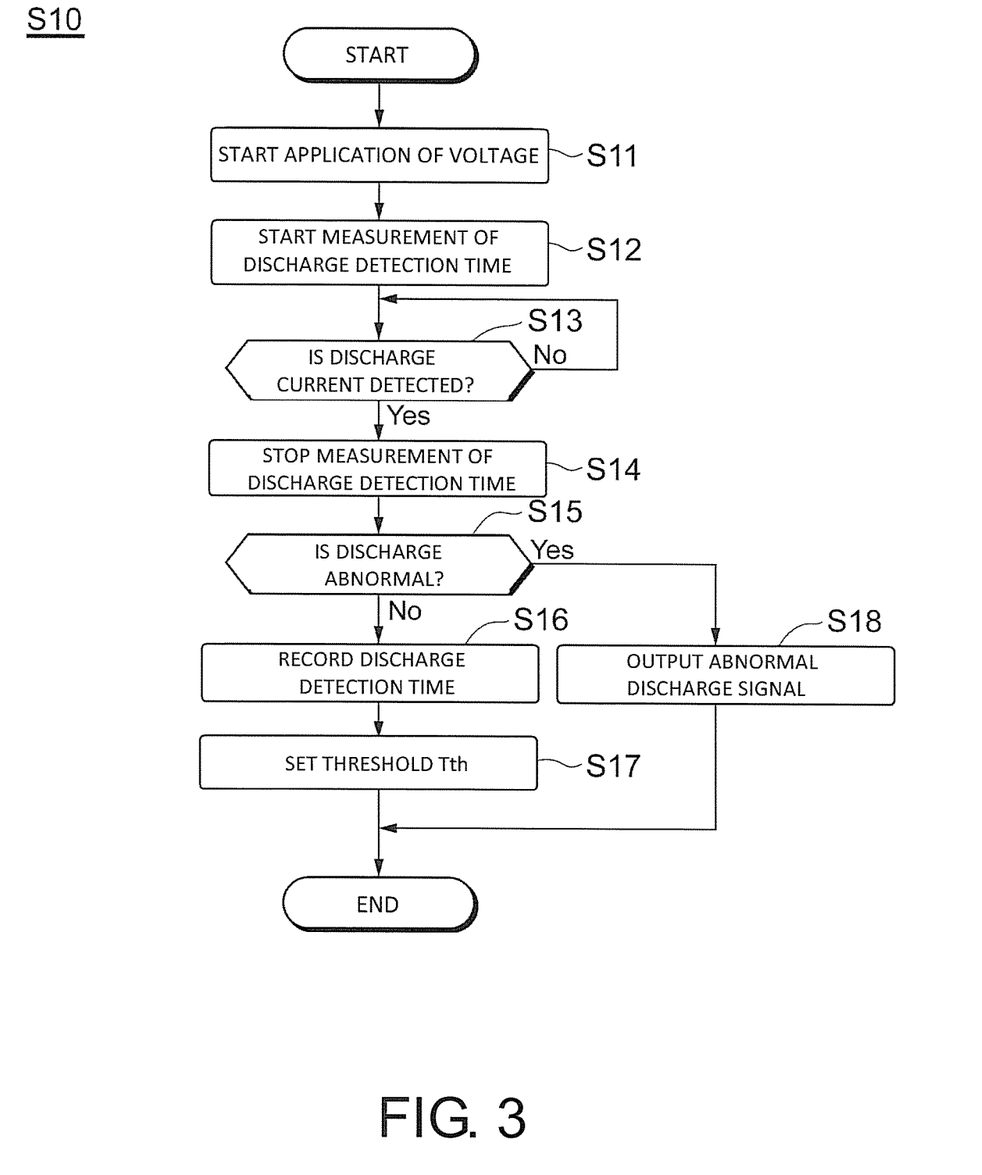
FIG. 3 is a flowchart showing one example of a discharge examination method according to this embodiment.

FIG. 3 is a flowchart showing one example of the discharge examination method according to this embodiment. Referring to FIG. 3, upon starting of a discharge examination process S10, first, the discharge start unit 56a outputs a voltage-application-start control signal to the voltage generation unit 52, and starts application of a voltage between the torch electrode 48 and the wire 42 (S11). In addition, the discharge start unit 56a outputs the start signal (start signal) to the timer unit 56b to start measurement of discharge detection time (S12).

Next, the discharge detection unit 56c determines whether or not a discharge current is detected based on the detection signal of the discharge current input from the current detection unit 53 (S13), and repeats the step in S13 until a discharge current is detected.

If a discharge current is detected as a result of determination in S13, the discharge detection unit 56c outputs a stop signal (stop signal) to the timer unit 56b to stop measurement of discharge detection time (S14).

Next, the discharge determination unit 57a determines whether or not discharge is abnormal based on the discharge detection time input from the discharge detection unit 56c (S15).

Figure 4:
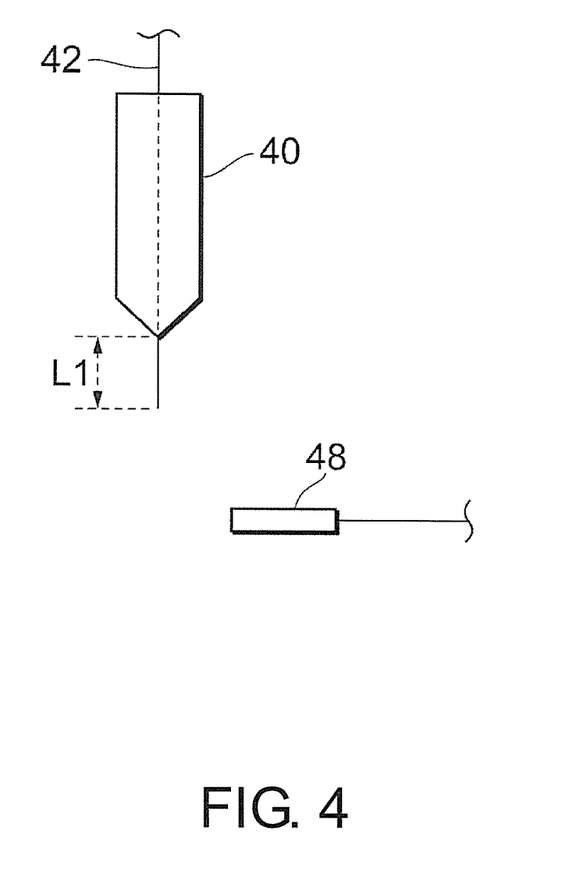
FIG. 4 is a diagram illustrating a wire extending from a bonding tool.

FIG. 4 is a diagram illustrating a wire extending from the bonding tool, showing one example in which the wire extending from the bonding tool is normal. As shown in FIG. 4, in a case in which the wire 42 of a predetermined length L1 extends from a tip of the bonding tool 40, producing discharge by applying a voltage between the torch electrode 48 and the wire 42 allows formation of a desired ball at the tip (one end) of the wire 42. In this case, the discharge is considered to be normal (normal discharge).

Figure 5A:
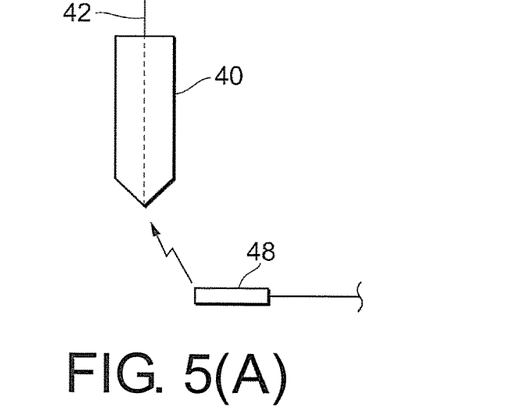
FIG. 5(A) through FIG. 5(C) are diagrams illustrating the wire extending from the bonding tool.
Figure 5B:
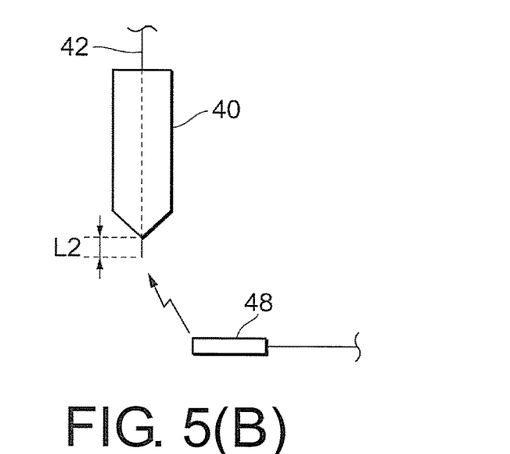
Figure 5C:
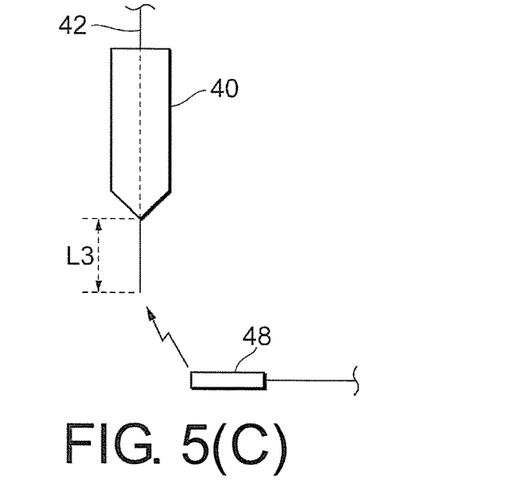

FIG. 5 shows diagrams illustrating the wire extending from the bonding tool; FIG. 5(A) is a diagram showing one example in which the wire extending from the bonding tool is abnormal, FIG. 5(B) is a diagram showing another example in which the wire extending from the bonding tool is abnormal, and FIG. 5(C) is a diagram showing yet another example in which the wire extending from the bonding tool is abnormal. In contrast, in a case in which as shown in FIG. 5(A), the wire 42 does not extend from the tip of the bonding tool 40 while the wire 42 is inserted through the bonding tool 40, discharge is not produced between the torch electrode 48 and the wire 42 even if a voltage is applied between the torch electrode 48 and the wire 42, and therefore it is not possible to form a ball at the tip (one end) of the wire 42 (a ball is not formed). In this case, discharge current can possibly flow through the wire 42 within the bonding tool 40 or discharge cannot be produced. Further, in a case in which as shown in FIG. 5(B), the wire 42 of a length L2 shorter than the predetermined length L1 (L2<L1) extends from the tip of the bonding tool 40, while discharge is produced between the torch electrode 48 and the wire 42 when a voltage is applied between the torch electrode 48 and the wire 42, it is not possible to form a desired ball at the tip (one end) of the wire 42 (a defective ball is formed). Moreover, in a case in which as shown in FIG. 5(C), the wire 42 of a length L3 longer than the predetermined length L1 (L3>L1) extends from the tip of the bonding tool 40, while discharge is produced between the torch electrode 48 and the wire 42 when a voltage is applied between the torch electrode 48 and the wire 42, it is likewise not possible to form a desired ball at the tip (one end) of the wire 42 (a defective ball is formed). In the cases shown in FIG. 5(A), FIG. 5(B), and FIG. 5(C), no ball can be formed or a desired ball cannot be formed at the tip of the wire 42 while discharge is produced and a discharge current is detected. Therefore, discharge in these cases is considered to be abnormal (abnormal discharge).

Here, the inventors of the disclosure have found that the discharge detection time after application of a voltage before discharge is produced in the cases shown in FIG. 5(A) and FIG. 5(B) is longer than that in the case shown in FIG. 4. As one reason, it is considered that as a distance (gap) between the torch electrode 48 and one of the bonding tool 40 and the tip of the wire 42 increases, it takes time to bring about breakdown of insulation of the distance (gap) to produce discharge. The inventors of the disclosure have also found that the discharge detection time after application of a voltage before discharge is produced in the case shown in FIG. 5(C) is shorter than that in the case shown in FIG. 4. As one reason, it is considered that as a distance (gap) between the torch electrode 48 and the tip of the wire 42 decreases, it does not take time to bring about breakdown of insulation of the distance (gap) to produce discharge.

Figure 6:
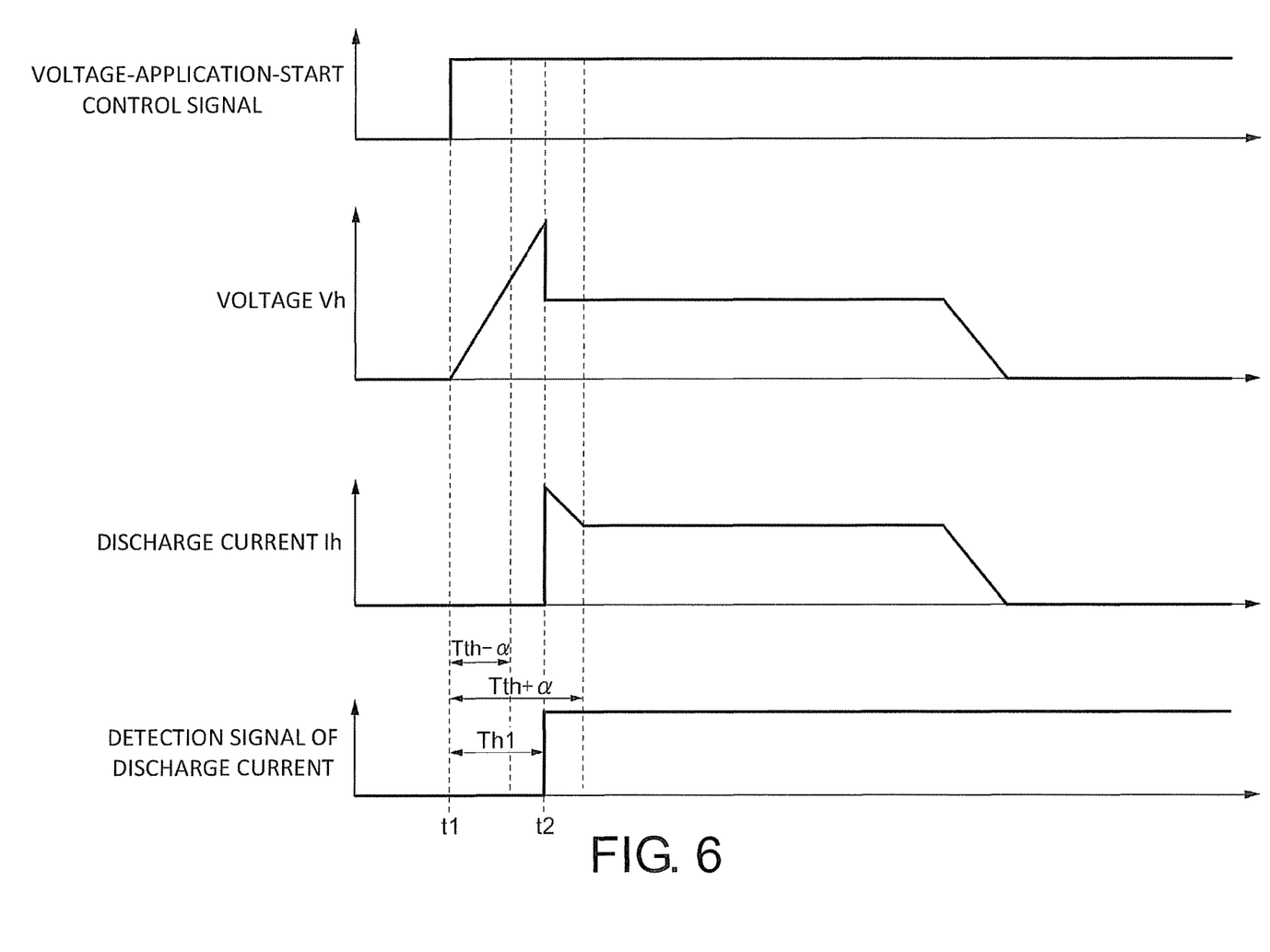
FIG. 6 is a time chart of one example of the discharge examination method according to this embodiment.
Figure 7:
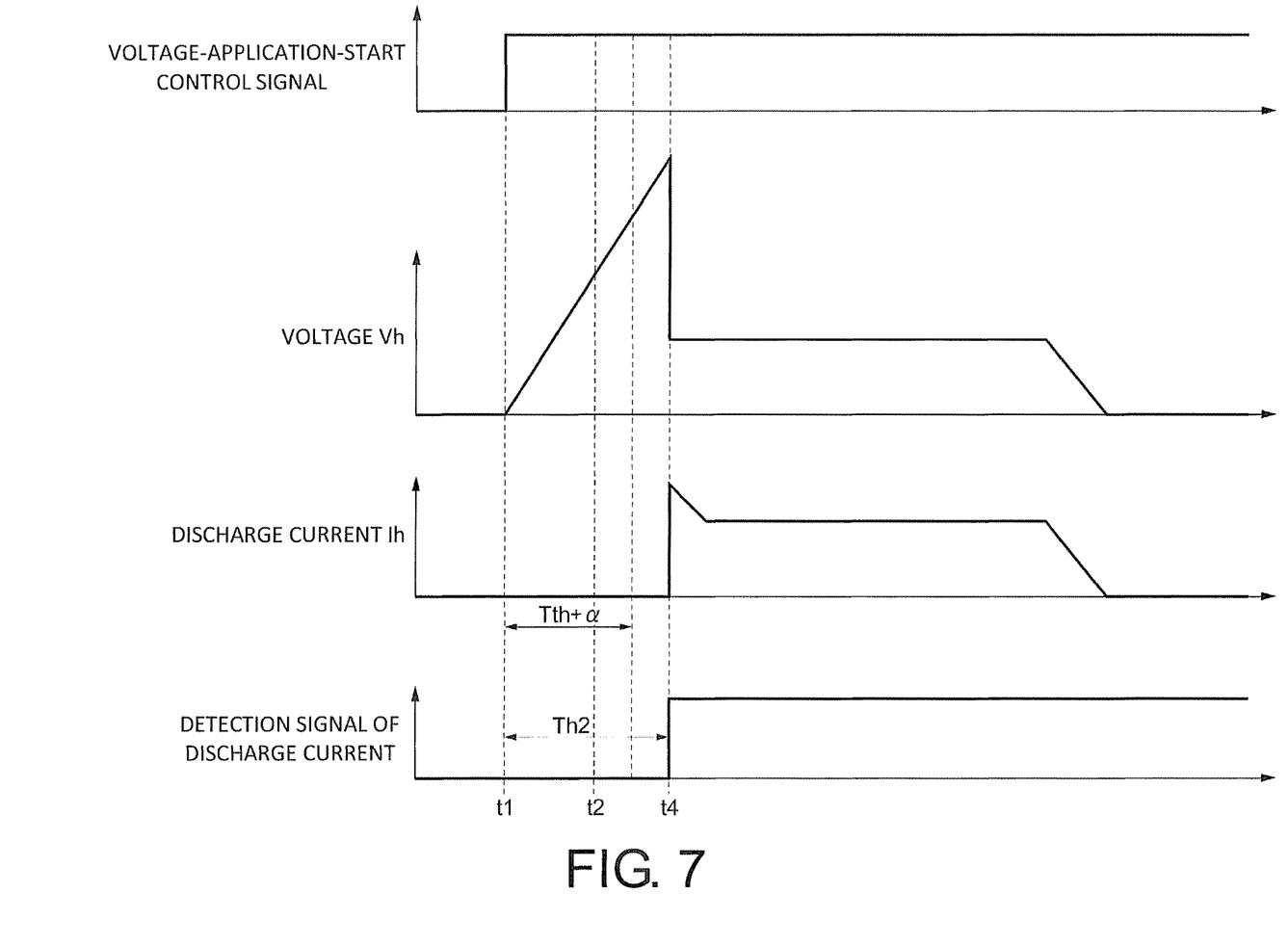
FIG. 7 is a time chart of one example of the discharge examination method according to this embodiment.
Figure 8:
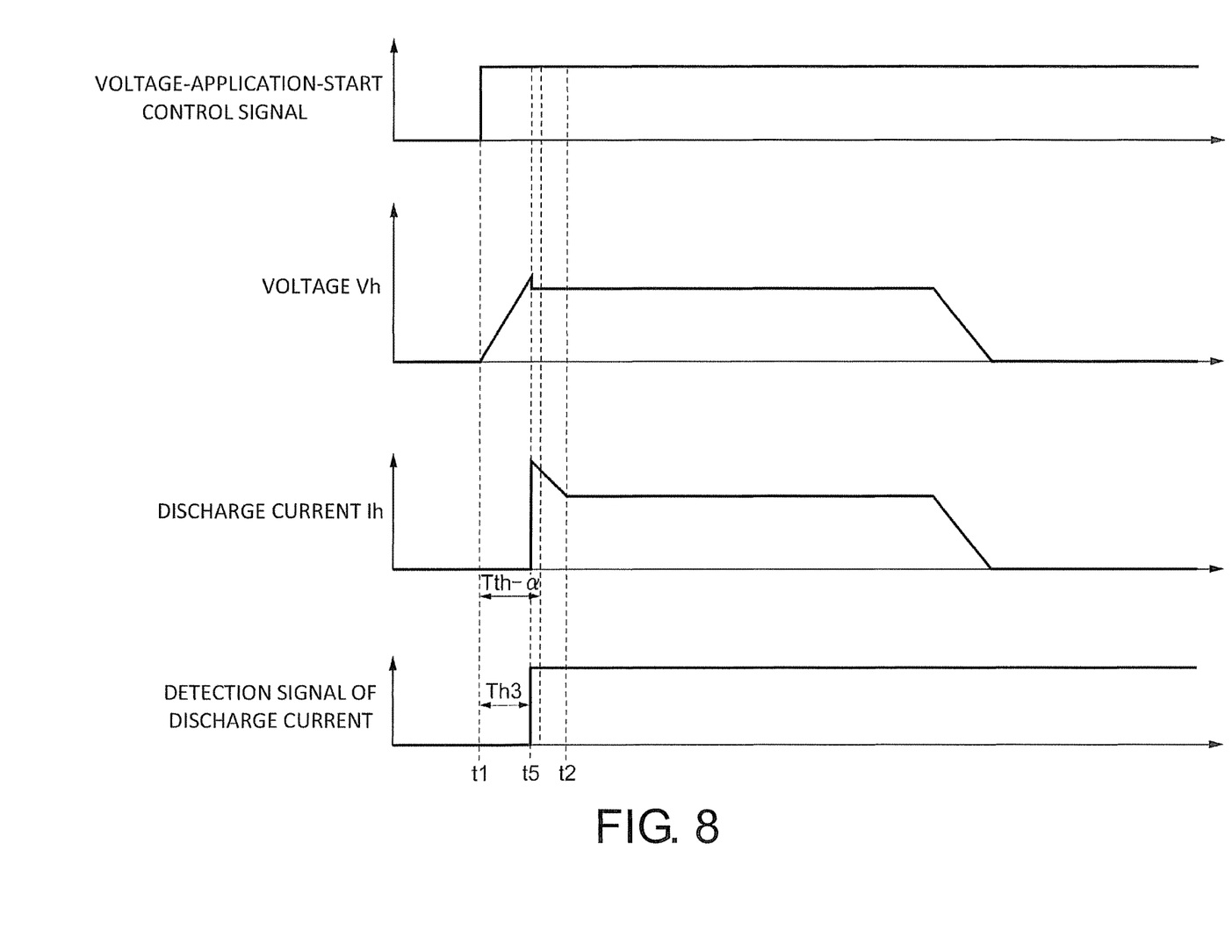
FIG. 8 is a time chart of one example of the discharge examination method according to this embodiment.

FIG. 6, FIG. 7, and FIG. 8 are time charts of examples of the discharge examination method according to this embodiment; FIG. 6 is an example in which discharge is normal, FIG. 7 is an example in which discharge is abnormal, and FIG. 8 is another example in which discharge is abnormal. Here, the time chart in FIG. 6 corresponds to the case shown in FIG. 4, the time chart in FIG. 7 corresponds to the cases shown in FIG. 5(A) and FIG. 5(B), and the time chart in FIG. 8 corresponds to the case shown in FIG. 5(C). In the case shown in FIG. 4, as shown in FIG. 6, at time t1, at which the discharge start unit 56a outputs a voltage-application-start control signal to the voltage generation unit 52, a voltage Vh is applied between the torch electrode 48 and the wire 42. The voltage Vh increases (rises) over time, and at time t2, at which discharge is produced between the torch electrode 48 and the wire 42, the voltage Vh decreases (drops) down to a predetermined value, and a discharge current Ih flows through the wire 42. At this time, the current detection unit 53 detects the discharge current Ih and outputs the detection signal of the discharge current to the discharge detection unit 56c, and a time period from time t1 to time t2, that is, discharge detection time Th1 is measured by the timer unit 56b. In the case shown in FIG. 6, the discharge detection time Th1 is normal time, e.g., about 33 [μs].

In contrast, in the cases shown in FIG. 5(A) and FIG. 5(B), as shown in FIG. 7, at time t1, at which the discharge start unit 56a outputs a voltage-application-start control signal to the voltage generation unit 52, the voltage Vh is applied between the torch electrode 48 and the wire 42. The voltage Vh increases (rises) over time. However, either the tip of the wire 42 does not extend at all from the bonding tool 40 or only the wire 42 of the length L2 that is shorter than the predetermined length L1 extends from the bonding tool 40, therefore discharge is not produced at time t2. Thereafter, at time t4, at which discharge is produced between the torch electrode 48 and the bonding tool 40, for example, the voltage Vh decreases (drops) down to a predetermined value, and the discharge current Ih flows through the wire 42 via the bonding tool 40. At this time, the current detection unit 53 detects the discharge current Ih and outputs the detection signal of the discharge current to the discharge detection unit 56c, and a time period from time t1 to time t4, that is, discharge detection time Th2 is measured by the timer unit 56b. In the case shown in FIG. 6, the discharge detection time Th2 is abnormal, e.g., about 60 [μs]. Further, in the case shown in FIG. 5(C), as shown in FIG. 8, at time t1, at which the discharge start unit 56a outputs a voltage-application-start control signal to the voltage generation unit 52, the voltage Vh is applied between the torch electrode 48 and the wire 42. The voltage Vh increases (rises) over time. However, as the wire 42 of a length L3 that is longer than the predetermined length L1 extends from the bonding tool 40, discharge is produced at time t5 between the torch electrode 48 and the wire 42 prior to time t2. Therefore, the voltage Vh decreases (drops) down to a predetermined value, and the discharge current Ih flows through the wire 42. At this time, the current detection unit 53 detects the discharge current Ih and outputs the detection signal of the discharge current to the discharge detection unit 56c, and a time period from time t1 to time t5, that is, discharge detection time Th3 is measured by the timer unit 56b.

Thus, by determining whether or not discharge is abnormal based on the discharge detection time after the application of a voltage before the discharge current is detected, it is possible to determine the discharge is abnormal when discharge is produced in a case in which as shown in FIG. 5(A), FIG. 5(B), or FIG. 5(C), either the tip of the wire 42 does not extend at all from the bonding tool 40, or the wire 42 extending from the bonding tool 40 is either shorter or longer than the predetermined length L1.

The determination on whether or not discharge is abnormal in a step of S15 in FIG. 3 is made using a threshold Tth, for example. Specifically, the discharge determination unit 57a sets a predetermined range Tth±α based on the threshold Tth, by reading the threshold Tth from the memory (recording means), and by adding or subtracting a predetermined value α to or from the read threshold Tth. Here, the predetermined value α can be a value previously recorded in the memory (recording means) or can be a value input by an operator via the operation unit 82 and the controller 80. Thereafter, the discharge determination unit 57a determines whether or not the discharge detection time input from the discharge detection unit 56c is out of the predetermined range Tth±α. As a result of determination, as shown in FIG. 6, if the discharge detection time Th1 is not out of the predetermined range Tth±α, that is, falls within the predetermined range Tth±α (within the predetermined range Tth±α) (Tth−α≤Th1≤Tth+α), the discharge determination unit 57a determines that the discharge is normal. In contrast, as shown in FIG. 7, if the discharge detection time Th2 is higher than an upper limit of the predetermined range and falls outside the predetermined range Tth±α (Th2>Tth+α), the discharge determination unit 57a determines that the discharge is abnormal. Further, as shown in FIG. 8, if the discharge detection time Th3 is lower than a lower limit of the predetermined range and falls outside the predetermined range Tth±α (Th3<Tth−α), the discharge determination unit 57a determines that the discharge is abnormal. As described above, by determining whether or not the discharge detection time is outside the predetermined range Tth±α based on the threshold Tth, it is possible to easily determine whether or not discharge is abnormal.

In this embodiment, the example in which the discharge determination unit 57a determines whether or not discharge is abnormal based on the discharge detection time input from the discharge detection unit 56c is described, but the disclosure is not limited to such an example. For example, the discharge determination unit 57a can determine whether or not discharge is abnormal based on the discharge detection time and the voltage value input from the discharge detection unit 56c.

As shown in FIG. 3, if the discharge is not abnormal (normal) as a result of determination in S15, the discharge determination unit 57a has the discharge detection time input from the discharge detection unit 56c be recorded in the memory (recording means) (S16).

Next, the threshold setting unit 57b sets (changes) the threshold based on the discharge detection time recorded in the recording means (memory) (S17). With this, as the threshold Tth based on the discharge detection time when discharge is normal is taken as a reference value of determination, it is possible to determine whether or not discharge is abnormal with a high degree of accuracy.

Specifically, for example, the threshold setting unit 57b reads the discharge detection time from the memory (recording means), and sets (changes) the discharge detection time as the threshold Tth. Finally, the threshold setting unit 57b writes and record the set (changed) threshold Tth in the memory (recording means).

Alternatively, for example, the threshold setting unit 57b can read most recent (newest) pieces of discharge detection time of a predetermined number from the memory (recording means), and calculate an average value of the pieces of discharge detection time of the predetermined number. In this case, the threshold setting unit 57b sets (changes) the calculated average value as the threshold Tth. Finally, the threshold setting unit 57b writes and record the set (changed) threshold Tth in the memory (recording means). With this, the threshold Tth based on the most recent (newest) pieces of the discharge detection time of the predetermined number when discharge is normal is taken as the reference value of determination. Therefore, even when the discharge detection time for normal discharge changes (shifts) due to deterioration of the torch electrode 48, for example, it is possible to determine whether or not discharge is abnormal with a high degree of accuracy.

After a step in S17, the threshold setting unit 57b terminates the discharge examination process S10.

In contrast, if discharge is abnormal as a result of determination in S15, the signal output unit 57c outputs an abnormal discharge signal to the controller 80 (S18). As this allows to stop operation of the wire-bonding apparatus 1, it is possible to prevent wire bonding from being performed with a ball being unformed or remaining defective.

After a step in S18, the signal output unit 57c terminates the discharge examination process S10.

In this embodiment, the example in which the signal output unit 57c outputs an abnormal discharge signal to the controller 80 when discharge is abnormal is described, but the disclosure is not limited to such an example. For example, the signal output unit 57c can also output a normal discharge signal to the controller 80 when discharge is normal.

As described above, according to this embodiment, by determining whether or not discharge is abnormal based on the discharge detection time after application of a voltage before a discharge current is detected, it is possible to determine the discharge is abnormal when discharge is produced in a case in which as shown in FIG. 4(B) or FIG. 4(c), either the tip of the wire 42 does not extend at all from the bonding tool 40, or the wire 42 extending from the bonding tool 40 is either shorter or longer than the predetermined length L1. Therefore, in the case in which no ball is formed or a desired ball is not formed at the tip of the wire 42, it is possible to prevent the wire-bonding apparatus 1 from performing wire bonding, and thus to reduce the percent defective (improve the yield rate) of semiconductor devices.

It should be noted that the disclosure is not limited to the above embodiment, and can be applied with modification in various manners.

Further, the examples and the applications described by way of the above embodiment of the disclosure can be combined, modified, or improved for many purposes as needed, and the disclosure is not limited to the above embodiment. It should be appreciated from the appended claims that aspects with such a combination, modification, and improvement can also be included in the technical scope of the disclosure.

The invention claimed is:

1. A discharge examination device for examining a discharge of a wire-bonding apparatus that applies a voltage between an electrode and a wire to procure the discharge therebetween, wherein the discharge is examined based on a discharge current generated between the electrode and a tip of the wire, the discharge examination device comprising:
a voltage detection unit configured to detect the voltage being applied between the electrode and the wire to procure the discharge therebetween;
a current detection unit configured to detect the discharge current flowing through the wire;
a timer unit configured to measure a discharge detection time based on a first time point at start of the application of the voltage between the electrode and the wire and a second time point at start of the detection of the discharge current, wherein the discharge detection time is a time period from the first time point to the second time point; and
a discharge determination unit configured to determine that a distance between the electrode and the tip of the wire is above or below a predetermined threshold based on the discharge detection time, wherein a discharge abnormal signal is output to the wire-bonding apparatus when determined that the distance between the electrode and the tip of the wire is above or below the predetermined threshold so as to stop an operation of the wire-bonding apparatus,
wherein the discharge detection time in which an extending length of the tip of the wire is shorter than a predetermined length of the tip of the wire during a normal discharge is greater than the discharge detection time in which the extending length of the tip of the wire is longer than the predetermined length of the tip of the wire during the normal discharge.

2. The discharge examination device according to claim 1, wherein the discharge determination unit determines whether or not the discharge detection time is out of a predetermined range based on a threshold, and determines that the discharge is abnormal when the discharge detection time is out of the predetermined range.

3. The discharge examination device according to claim 2, wherein
the discharge determination unit causes a memory to record the discharge detection time if the discharge is determined to be not abnormal, and
the discharge examination device further comprises: a threshold setting unit configured to set the threshold based on the discharge detection time recorded in the memory.

4. The discharge examination device according to claim 3, wherein
the threshold setting unit sets the threshold, when the discharge detection time is recorded in the memory, based on a predetermined number of pieces of the discharge detection time that are most recently recorded.

5. The discharge examination device according to claim 2, further comprising:
a signal output unit configured to output the discharge abnormal signal to the wire-bonding apparatus when the discharge determination unit has determined that the discharge is abnormal, the discharge abnormal signal indicating that the discharge is abnormal.

6. The discharge examination device according to claim 1, wherein
the discharge determination unit determines whether or not the discharge is abnormal based on the discharge detection time and the voltage.

7. A wire-bonding apparatus for bonding a ball to a bonding target, the wire-bonding apparatus comprising:
an electrode served as a torch electrode;
a bonding tool for bonding a ball that is formed on a tip of a wire paying out from a tip of the bonding tool; and
a discharge examination device for examining a discharge that applies a voltage between the electrode and the wire to procure the discharge therebetween, the discharge examination device including:
a current detection unit configured to detect a discharge current flowing through the wire, wherein the discharge is examined based on the discharge current generated between the electrode and a tip of the wire;
a voltage detection unit configured to detect the voltage being applied between the electrode and the wire to procure the discharge therebetween;

a timer unit configured to measure a discharge detection time based on a first point at start of the application of the voltage between the electrode and the wire and a second time point at start of the detection of the discharge current, wherein the discharge detection time is a time period from the first time point to the second time point; and a discharge determination unit configured to determine that a distance between the electrode and the tip of the wire is above or below a predetermined threshold based on the discharge detection time, wherein a discharge abnormal signal is output to the wire-bonding apparatus when determined that the distance between the electrode and the tip of the wire is above or below the predetermined threshold so as to stop an operation of the wire-bonding apparatus, wherein the discharge detection time in which an extending length of the tip of the wire is shorter than a predetermined length of the tip of the wire during a normal discharge is greater than the discharge detection time in which the extending length of the tip of the wire is longer than the predetermined length of the tip of the wire during the normal discharge.

8. A discharge examination method of examining a discharge of a wire-bonding apparatus that applies a voltage between an electrode and a wire to procure the discharge therebetween, wherein the discharge is examined based on a discharge current generated between the electrode and a tip of the wire, the discharge examination method comprising:

a current detecting step of detecting the discharge current owing through the wire;

a voltage detecting step of detecting the voltage being applied between the electrode and the wire to procure the discharge therebetween;

a timer step of measuring a discharge detection time based on a first time point at start of the application of the voltage between the electrode and the wire and a second time point at start of the detection of the discharge current, wherein the discharge detection time is a time period from the first time point to the second time point; and a discharge determining step of determining that a distance between the electrode and the tip of the wire is above or below a predetermined threshold based on the discharge detection time, wherein a discharge abnormal signal is output to the wire-bonding apparatus when determined that the distance between the electrode and the tip of the wire is above or below the predetermined threshold so as to stop an operation of the wire-bonding apparatus, wherein the discharge detection time in which an extending length of the tip of the wire is shorter than a predetermined length of the tip of the wire during a normal discharge is greater than the discharge detection time in which the extending length of the tip of the wire is longer than the predetermined length of the tip of the wire during the normal discharge.

\* \* \* \* \*